(12) United States Patent
Shealy et al.

(10) Patent No.: US 12,062,738 B2
(45) Date of Patent: *Aug. 13, 2024

(54) BERYLLIUM DOPED GAN-BASED LIGHT EMITTING DIODE AND METHOD

(71) Applicant: POWER INTEGRATIONS, INC., San Jose, CA (US)

(72) Inventors: James R. Shealy, Ithaca, NY (US); Richard J. Brown, Ithaca, NY (US)

(73) Assignee: POWER INTEGRATIONS, INC., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/932,251

(22) Filed: Sep. 14, 2022

(65) Prior Publication Data

US 2023/0008120 A1    Jan. 12, 2023

Related U.S. Application Data

(62) Division of application No. 16/813,337, filed on Mar. 9, 2020, now Pat. No. 11,469,348.

(51) Int. Cl.
*H01L 33/14* (2010.01)
*H01L 33/00* (2010.01)
*H01L 33/06* (2010.01)
*H01L 33/12* (2010.01)
*H01L 33/32* (2010.01)

(52) U.S. Cl.
CPC ........ *H01L 33/145* (2013.01); *H01L 33/0025* (2013.01); *H01L 33/007* (2013.01); *H01L 33/0095* (2013.01); *H01L 33/06* (2013.01); *H01L 33/12* (2013.01); *H01L 33/325* (2013.01)

(58) Field of Classification Search
CPC ...................................... H01L 33/06
See application file for complete search history.

(56) References Cited

U.S. PATENT DOCUMENTS

2007/0194709 A1*  8/2007  Kato ................. H01L 24/17
                                                257/E33.059
2011/0024722 A1*  2/2011  Moustakas ......... H01L 33/24
                                                257/E21.09
2020/0328296 A1* 10/2020  Hwang ............ H01L 29/66462

* cited by examiner

*Primary Examiner* — Moazzam Hossain
*Assistant Examiner* — Hajar Kolahdouzan

(57) ABSTRACT

The invention described herein provides a method and apparatus to realize incorporation of Beryllium followed by activation to realize p-type materials of lower resistivity than is possible with Magnesium. Lower contact resistances and more effective electron confinement results from the higher hole concentrations made possible with this invention. The result is a higher efficiency GaN-based LED with higher current handling capability resulting in a brighter device of the same area.

20 Claims, 9 Drawing Sheets

BERYLLIUM DOPED GAN-BASED LIGHT EMITTING DIODE AND METHOD

CROSS-REFERENCES TO RELATED APPLICATIONS

This application is a divisional of and claims priority to U.S. patent application Ser. No. 16/813,337, filed Mar. 9, 2020, the contents of which are incorporated herein in their entirety.

BACKGROUND OF THE INVENTION

The present invention provides techniques, including a structure, method, and device, provided in a gallium and nitrogen containing material having improved electrical properties. In an example, the present invention includes a method and resulting structure using a beryllium species configured in a region of gallium and nitrogen containing material, such as GaN, AlGaN, InGaN, or AlGaInN. Merely by way of example, the invention has been applied to a light emitted diode device. However, the techniques can be applied other types of device structures and applications.

Light-emitting diode (LED) devices have revolutionized the world. In the early 1960's, Nick Holonyak, who is an American engineer and educator, developed an LED that emitted visible red light instead of infrared light. Holonyak was then working at General Electric's research laboratory in Syracuse, New York. The use of red LEDs proliferated into indicator, display, and other devices. Other types of LEDs, such as blue LEDs, relied upon gallium nitride based materials, and have also proliferated into displays, such as those used in a smart phone, flat panel displays, and general lighting. Although many advances have occurred in the field of LEDs and their processing, various limitations still exist.

From the above, it is seen that techniques for improving electronic devices are highly desirable.

BRIEF SUMMARY OF THE INVENTION

According to the present invention, techniques, including a structure, method, and device, in a gallium and nitrogen containing material having improved electrical properties are provided. In an example, the present invention includes a method and resulting structure using a beryllium species configured in a region of gallium and nitrogen containing material, such as GaN, AlGaN, InGaN, or AlGaInN. Merely by way of example, the invention has been applied to a light-emitting diode (LED) device. However, the technique can be applied other types of device structures and applications.

In an example, the present invention provides a GaN-based pn junction, which can be configured on a device. The junction has an n-type GaN sample comprising either an intentionally (i.e., selected) doped impurity or a non-intentionally doped impurity, e.g., non-selected dopant. In an example, the term selected means chose one over others, but can have other meanings according to one of ordinary skill in the art. The junction has a region of the GaN sample comprising a beryllium dopant configured by ion implanted beryllium atoms. In an example, the implanted beryllium atoms are activated within the region configured by a high temperature annealing process to form a low resistivity p-type layer of less than 10 ohm-cm to $10^{-3}$ ohm-cm. In an example, an n-type layer comprises at least one layer selected from a silicon doped layer from the group of alloys of AlGaN, InGaN, and AlGaInN; and an undoped layer selected from a group of alloys comprising one of AlGaN, InGaN, or AlGaInN.

In an example, the invention also provides a method of processing a semiconductor device. The method includes providing a semiconductor substrate. The semiconductor substrate is selected from a gallium and nitrogen bearing material. In an example, the gallium and nitrogen bearing material is at least one selected from GaN, AlGaN, InGaN, or AlGaInN. In an example, the method includes introducing a plurality of impurities into a region of the semiconductor substrate using an ion implantation process such that the region has been damaged by the ion implantation process. In an example, the method includes encapsulating the region of the semiconductor substrate using a nitrogen bearing material. The nitrogen bearing material is selected from a nitride material or an ammonia material. In an example, the method includes performing an isothermal anneal at temperatures greater than 800 degrees Celsius for a time period of greater than one second on the region of the semiconductor substrate while the region has been encapsulated and subjecting the region of the semiconductor substrate using a pulsed laser to achieve a surface temperature greater than 1000 degrees Celsius for a time period of shorter than one second. The method includes performing an isothermal anneal on the region of the semiconductor substrate in a hydrogen and ammonia free ambient at temperatures in the range from 700 to 900 degrees Celsius for time period of greater than one second to facilitate removal of atomic hydrogen entities from the region of the semiconductor substrate to form a resulting region.

One or more benefits are achieved over pre-existing techniques using the invention. In particular, the invention enables a cost-effective technique for providing improved electrical characteristics of a gallium and nitrogen containing material. In an example, the technique uses a beryllium species configured with implantation techniques into a crystalline gallium and nitrogen containing material to form a low resistivity material for LED devices, among others. In a specific embodiment, the present device can be manufactured in a relatively simple and cost effective manner. Depending upon the embodiment, the present apparatus and method can be manufactured using conventional materials and/or methods according to one of ordinary skill in the art. The present device uses a gallium and nitrogen containing material that is single crystalline or can be other configurations. Depending upon the embodiment, one or more of these benefits may be achieved. Of course, there can be other variations, modifications, and alternatives.

A further understanding of the nature and advantages of the invention may be realized by reference to the latter portions of the specification and attached drawings.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which.

DETAILED DESCRIPTION OF THE INVENTION

According to the present invention, techniques, including a structure, method, and device, in a gallium and nitrogen containing material having improved electrical properties are provided. In an example, the present invention includes a method and resulting structure using a beryllium species configured in a region of gallium and nitrogen containing material, such as GaN, AlGaN, InGaN, or AlGaInN. Merely by way of example, the invention has been applied to a light-emitting diode (LED) device. However, the techniques can be applied other types of device structures and applications.

As background information, GaN-based LEDs suffer from poor resistivity p-type regions typically greater than 1 ohm-cm. Typically, only one in one hundred Mg atoms are capable of producing a hole in GaN at room temperature due to its deep binding energy (estimated to be 230 to 250 meV) and its passivation with atonic hydrogen. Reducing this resistivity by using Beryllium as the acceptor impurity will have a major impact on GaN-LED performance. Prior to this invention, there have been no successful disclosures of Beryllium as a p-type dopant in GaN resulting in low resistivity p-type materials. Because Beryllium is known to have a shallower binding energy in GaN (estimated to be 90 MeV) and related materials, higher hole concentrations are possible. This results in lower operating voltages and more effective electron confinement (higher emission intensity) for the same operating current.

The multi-layer structures for GaN-based LEDs take on many forms depending on the choice of the growth substrate and the final device geometry including flip chip designs where a carrier substrate is used and the growth substrate is removed. This invention relates to the top of the LED multi-layer epitaxial structure as it appears on the growth substrate. These are the p-type epitaxial layers, which are almost always grown on top of the active region.

Figure 1:
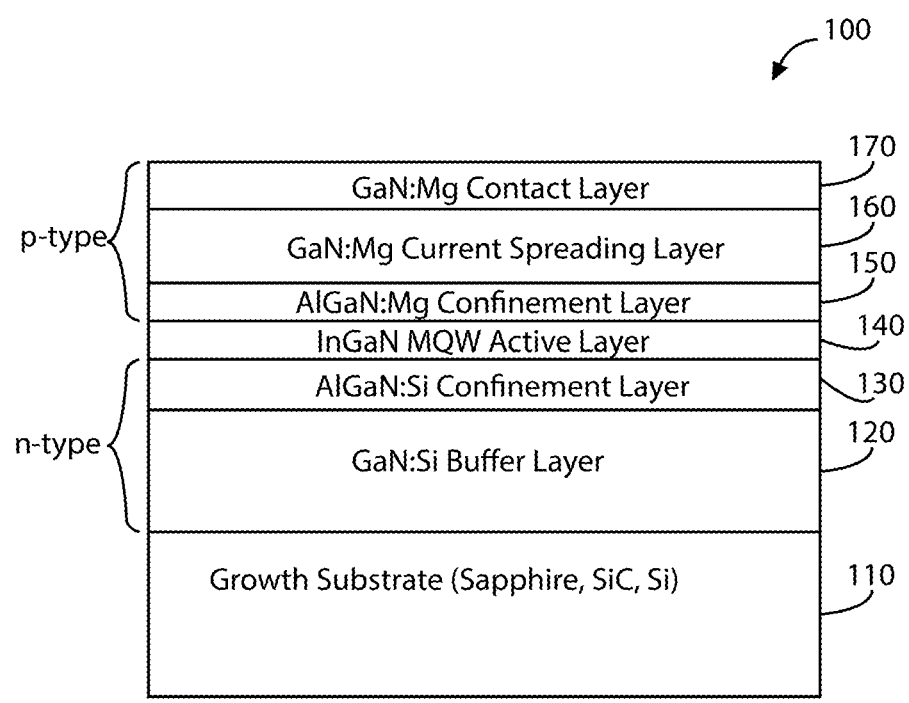
FIG. 1 is a simplified diagram of an LED device according to a conventional example.

FIG. 1 is a simplified diagram of an LED device 100 according to a conventional example. As shown, a typical GaN-based epitaxial LED structure is shown. The n-type layers (120, 130) are shown below the active region 140 and the p-type layers (150, 160, and 170) are shown on top of the active region 140. In the prior art, the layers are grown by Metal Organic Chemical Vapor Deposition (MOCVD) with silicon as the n-type dopant and magnesium as the p-type dopant. The n-type layers typically include a silicon doped, n-type GaN buffer region 120 and a silicon doped GaN or AlGaN carrier confinement region 130. The active region 140 can be multi-quantum well (MQW) with GaN barrier layers (located between the quantum wells) and InGaN quantum wells. The active region 140 may also consist of doped barrier MWQ regions. The active regions 140 are also realized with doped GaN regions without quantum wells (zinc acceptor impurities have been used).

The p-type layers, starting with the lower most layer on top of the active region 140 typically include a magnesium doped, p-type GaN or a AlGaN carrier confinement region 150. The carrier being confined in this layer are electrons, which are injected from the lower n-type confinement layer 130, shown as AlGaN:Si in FIG. 1. Using an AlGaN:Mg confinement layer 150, an additional potential barrier from the conduction band offset at the AlGaN/GaN interface aids in the electron confinement to the active region 140, but the polarization induced electric field at this interface reduces its effectiveness. It is well known that the efficiency droop in GaN-based LEDs is a high level injection phenomena whose origin is in the electron confinement layer structure, which is sometimes referred to as an electron blocking layer. Injected electrons escape the MQW active region and recombine in the p-type confinement layer itself. Complex band engineered structures have been investigated, including AlGaInN, InGaN and graded bandgap AlGaN p-type regions layers that reduce the polarization induced electric fields. Using these complex structures, which do not lend themselves the manufacturing processes, the internal and external quantum efficiency can be improved by over 20% resulting from reduced electron leakage from the active region.

Figure 2:
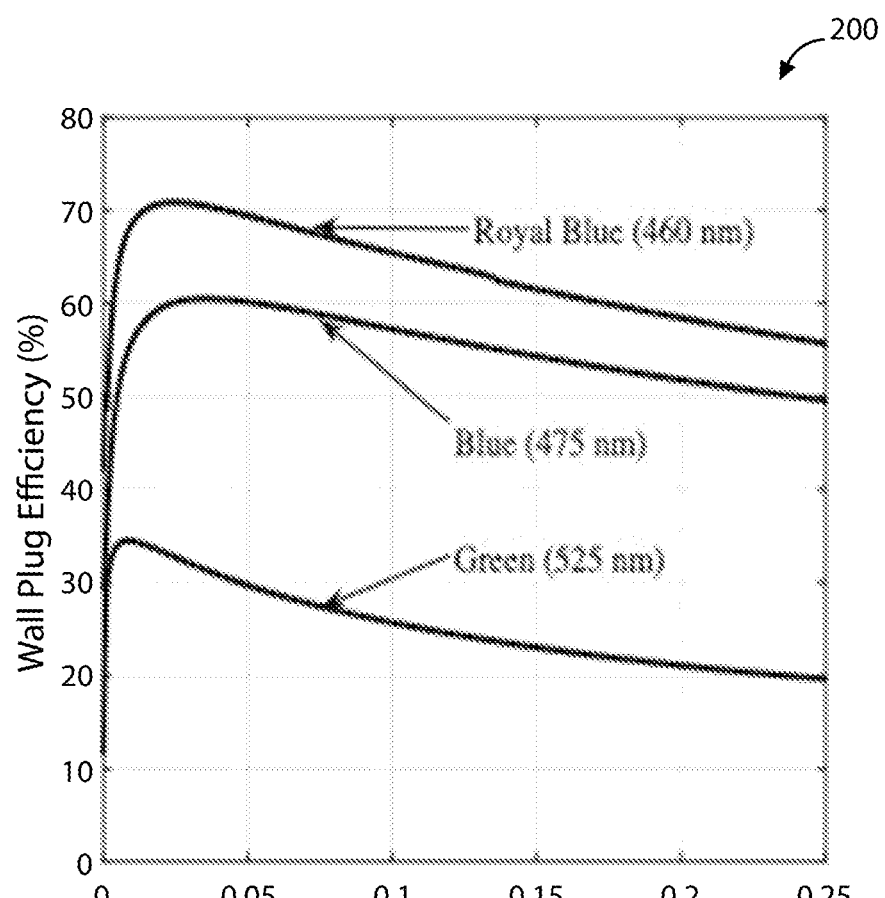
FIG. 2 is a graph of wall plug efficiency vs. current for typical high power GaN-based LEDs.

FIG. 2 is a graph of wall plug efficiency vs. current for typical high power GaN-based LEDs. As shown, graph 200 illustrates the efficiency droop measured with typical high power GaN-based LEDs with a PIN25D photo diode (with published photo response curves). The efficiencies are wall plug-optical power out over electrical power in. As is evident from these curves, as the diode current is increased beyond the peak, the efficiencies drop by more than 20%.

In an example, the present device and method can achieve a higher efficiency with a higher hole concentration. In an example, the higher efficiency can lead to an efficiency drop of less than 20%, less than 15%, or even less than 10%. Of course, the amount of improved efficiency can depend upon other factors as well.

Referring back to FIG. 1, on top of the AlGaN or GaN p-type confinement layer is a current spreading layer 160, which is a heavier doped p-type GaN:Mg layer. On flip chip designs, this layer can be thin or eliminated entirely as a blanket p-type reflecting ohmic contact layer is used, which usually incorporates silver in the ohmic metallization. Current spreading is not an issue with the blanket ohmic metallization (meaning the entire surface is coated with metal). Finally, the top most layer is the heaviest doped GaN:Mg contact layer 170, which is used to minimize the specific ohmic contact resistance. With GaN:Mg with a hole concentration as high as $5(10^{17})$ cm$^{-3}$, a typical specific contact resistance is at best low to mid $10^{-4}$ ohm-cm$^2$. The added series resistance from this contact is obtained by dividing the specific contact resistance by the area of the contact. An additional series resistance results from the ohmic conduction in the p-type layers to the active layer, which includes a spreading resistance if the entire LED surface is not covered with ohmic metallization. The resistivity of the p-type confinement layer is optimistically as low as 3-5 ohm-cm, resulting in a specific ohmic resistance in a 0.1 micron thick region of $3-5(10^{-4})$ ohm-cm$^2$. As a result, the added series resistance from the ohmic contact and p-type ohmic conduction is on the order of $10^{-3}$ ohm-cm$^2$. As a result, a 1 mm by 1 mm LED die would experience a series resistance from the p-type side of the diode of 0.1 ohms, not including any spreading resistance.

Figure 3:
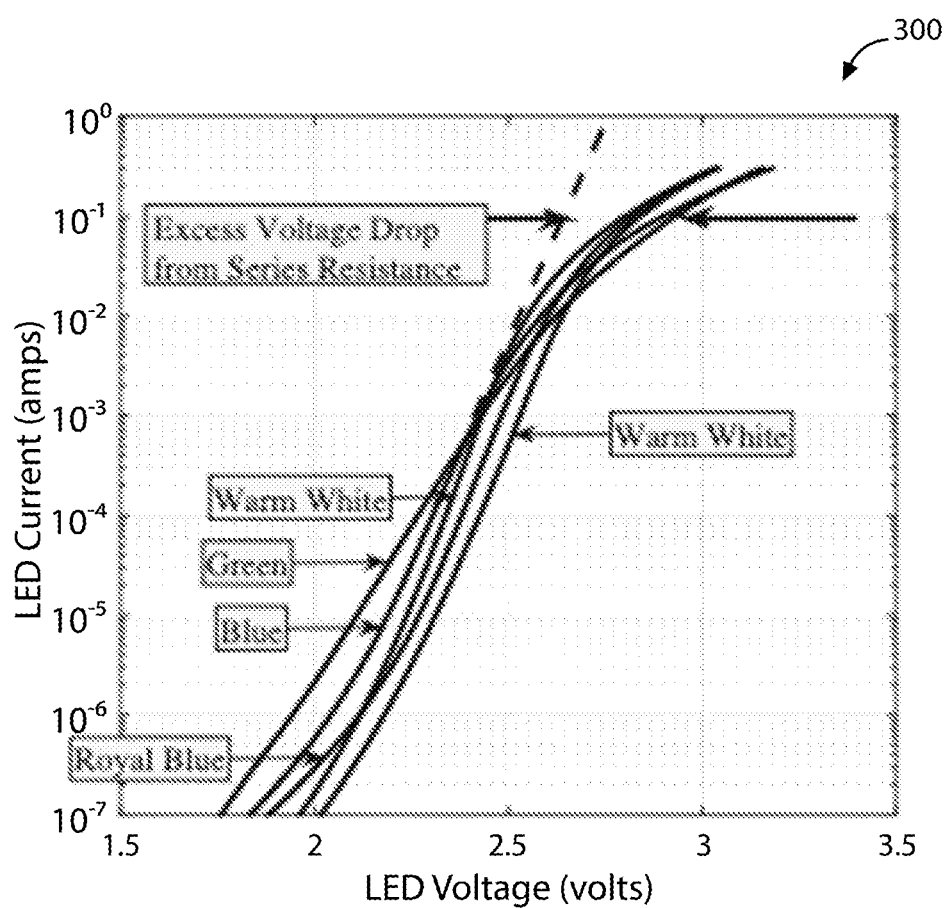
FIG. 3 is a graph of the current vs. voltage for typical high power GaN-based LEDs plotted on a logarithmic current axis.

FIG. 3 shows a graph 300 of the current vs. voltage of typical high power GaN-based LEDs plotted on a logarithmic current axis versus a voltage axis. The departure from linearity of each curve (the dashed line representing the slope of the blue LED) represents the excess voltage which is dropped on the series resistance of each LED. The blue LED has a series resistance of roughly 1.5 ohms from this data. The power dissipation on the series resistances is 15 mW, which is 5% of the total power consumed in the blue LED. Note that, as the diode current is increased, the voltage drop and power dissipation on the series resistance becomes larger and effectively places an upper limit on the LED operating current.

In an example, the invention described uses Beryllium as the acceptor impurity to enhance the GaN-based LED performance. Because Beryllium has a smaller binding energy than Magnesium in GaN (90 meV vs. 250 meV) and AlGaN materials, higher hole concentrations are possible in the electron confinement layer and in the current spreading and ohmic contact layers of the LED epitaxial structure. It is estimated that a 20% improvement on LED efficiency will result from increasing the hole concentration by one order of magnitude in these regions. Currently, with Magnesium, holes concentrations in the electron confinement layer are typically in the low $10^{17}$ cm$^{-3}$ range, while, with Beryllium, hole concentrations in the mid to high $10^{18}$ cm$^{-3}$ range are possible at room temperature. This assumes that a net of one in ten Beryllium atoms are active acceptors, similar to what is observed with Magnesium.

There have been several attempts to use Beryllium as a p-type dopant in GaN, including the use of ion implantation followed by activation anneals and by Molecular Beam Epitaxy. Prior to this invention, all previous efforts have failed to produce low resistivity p-type films. Using ion implantation, the activation temperature for acceptors in GaN is estimated to be 1500° C. The equilibrium nitrogen gas pressure over GaN is greater than $10^4$ atmospheres at this temperature. As a result, during isothermal annealing at temperatures required heal the damage produced by the acceptor ion implantation, the GaN crystal will suffer from severe nitrogen loss in a near atmospheric pressure environment. The resulting nitrogen vacancies behave as donors and serving to compensate the implanted acceptor impurities if they became active during the anneal. This assumes that the crystal did not fall apart leaving puddles of Ga on the crystal surface.

The disclosed invention uses the ion implantation technique to introduce the acceptor impurities in GaN. Both Magnesium and Beryllium group II impurities have been ion implanted into separate samples of silicon doped n-type GaN (electron concentration of $10^{16}$ cm$^{-3}$) and grown on single crystal GaN n$^+$ substrates.

Figure 4:
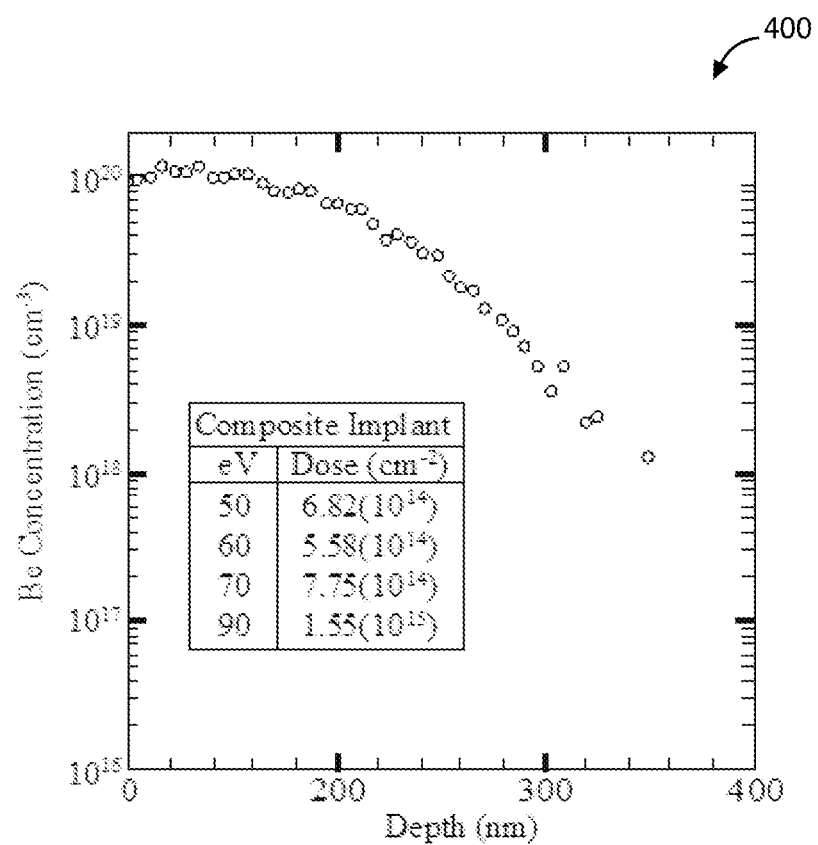
FIG. 4 is a graph showing the distribution of Beryllium atoms in an ion implanted GaN sample according to an example of the present invention.

FIG. 4 is a graph showing the simulated distribution of Beryllium atoms in an ion implanted GaN sample according to an example of the present invention. The sample was covered with 200 nm of Si$_3$N$_4$ (silicon nitride deposited by PECVD) to produce a peak concentration of Beryllium near the sample surface as shown. This Si$_3$N$_4$ cover layer also lowers the implant damage in the underlying GaN. This layer was removed after the ion implantation. Four implants at different acceleration potentials and doses were used to produce the profile that is shown. After the implant was completed the Si$_3$N$_4$ cover layer was removed.

Prior to annealing, a crystalline AlN capping layer was grown on the implanted sample's surface by MOCVD. The AlN capping layer serves to prevent nitrogen loss in addition to using the short duration high temperature anneal step. The thickness of the AlN was 70 nm. The annealing process begins with an isothermal anneal at 1000° C. in hydrogen and ammonia gas near atmospheric pressure. The ammonia prevents nitrogen loss and introduces atomic hydrogen in the crystal. This step removes much of the ion implant damage but it fails to activate the group II acceptor impurities. The acceptor activation is realized in the next process step. To activate the Mg and Be acceptors, an activation temperature of 1500° C. is desired while simultaneously preventing nitrogen loss from the crystal. To accomplish this the time of the thermal anneal must be reduced to the nanosecond time scale. This was achieved exposing the implanted wafer surface to a pulsed laser annealing using a XeCl excimer laser (wavelength is 308 nm). The pulse energy density was 600 mJ/cm$^2$ and a pulse duration of 30 nsec. The 3 mm by 3 mm exposure aperture was scanned across the entire wafer surface one pulse at a time. The wafer surface temperature was over 1000° C. for 10 nsec and reached a peak temperature of 1500° C. The appearance of the wafer's surface did not change during this treatment. Higher pulse energy densities produced Gallium droplets on the wafer surface indicating severe nitrogen loss. The final process step is an isothermal anneal in nitrogen gas at 800° C., which is a sufficiently low temperature to avoid nitrogen loss from the wafer surface. This anneal is designed to remove atomic hydrogen from the sample, which is known to passivate acceptor impurities rendering them electronically inactive. This final anneal typically increases the hole concentration to values exceeding 10% of the total volume concentration of Beryllium atoms. After the final anneal, the AlN capping layer was removed. A selective area metallization was applied to the samples top surface serving as an anode. The backside surface of the n$^+$ GaN substrate serves as the cathode. The resulting GaN homo-junction pn diode had a sharp turn on voltage of 3.0 volts, low reverse leakage current, and substantial UV emission under forward bias.

FIGS. 5-9 are simplified diagrams illustrating a method of fabricating an LED device according to an example of the present invention. In particular, this method provides for the fabrication of a Be-doped GaN-based LED device. These diagrams are merely examples, which should not unduly limit the scope of the claims herein. For these figures, the same reference numbers refer to the same elements or components of the LED devices. Those of ordinary skill in the art will recognize other variations, modifications, and alternatives.

Figure 5:
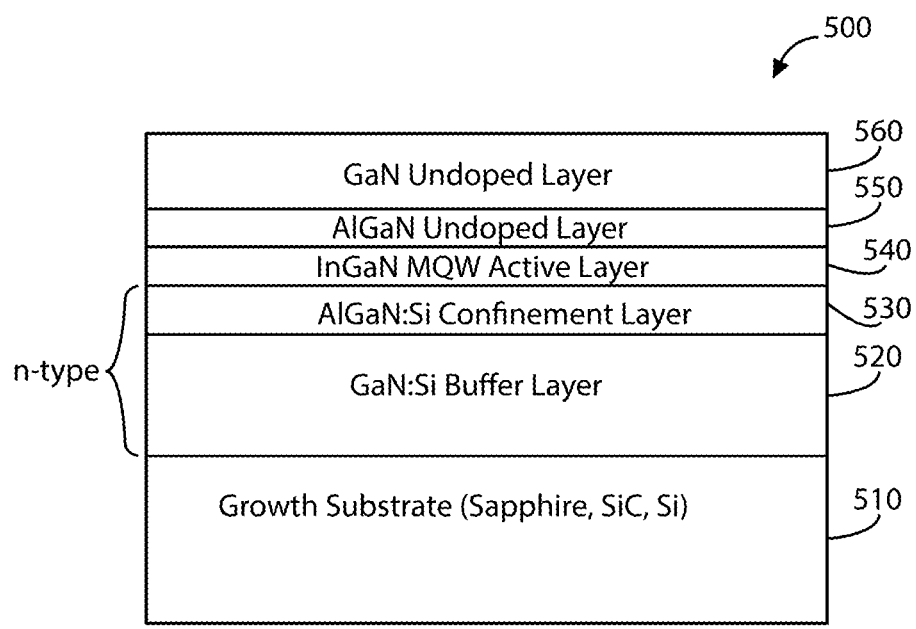
FIGS. 5-9 are simplified diagrams illustrating a method of fabricating an LED device according to an example of the present invention.

In an example, the method of processing the beryllium is illustrated using FIG. 5. In an example, beryllium metal is vaporized, and then subjected into an implantation process. In a preferred embodiment of the invention, LED Structures 500 are prepared using an epitaxial growth process on a growth substrate 510, preferably by Metal Organic Chemical Vapor Deposition (MOCVD) on growth substrates 510 including Sapphire, Silicon Carbide or Silicon. As discussed above for FIG. 1, the preparation of the LED structure 500 includes forming n-type layers, such as a GaN:Si buffer layer 520 and a silicon doped GaN or AlGaN confinement layer 530, and an active layer 540. However, the layers that are normally doped p-type with Magnesium (referring back to FIG. 1), which include an electron confinement layer 550 (also referred to as an electron blocking layer), a current spreading layer 560 and an ohmic contact layer (shown in FIG. 6), are grown un-intentionally doped.

Figure 6:
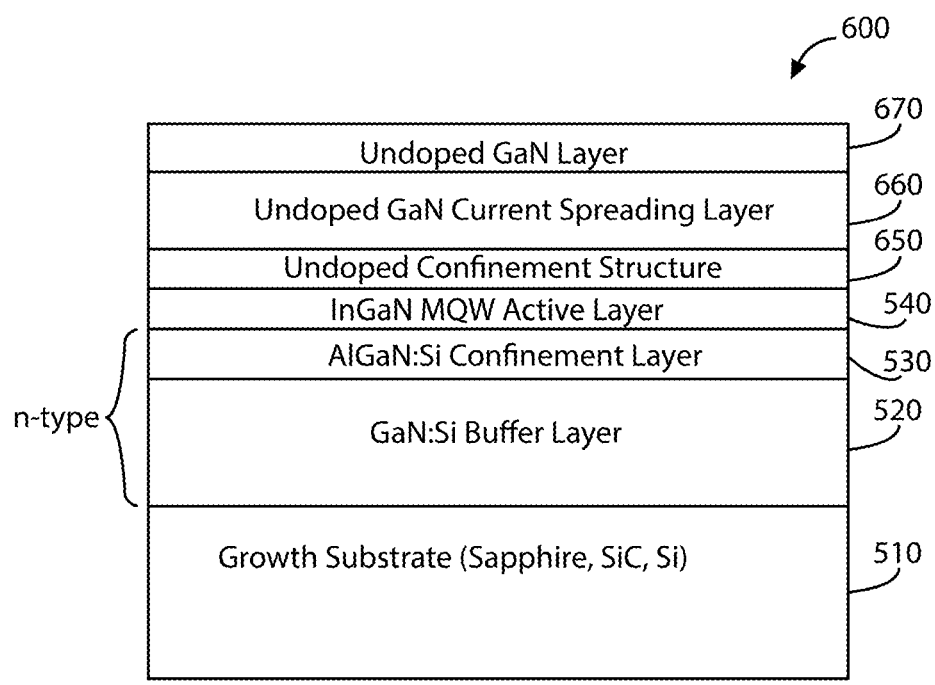

In FIG. 6, the typical GaN-based LED structure as grown is shown for this embodiment. As shown in structure 600, the AlGaN undoped layer 550 of FIG. 5 is configured as an undoped confinement structure 650, such as a p-type GaN or AlGaN confinement structure, or the like. The undoped GaN layer 560 of FIG. 5 is configured as an undoped GaN current spreading layer 660. And an undoped GaN layer 670 is formed overlying the undoped GaN current spreading layer 660. Of course, there can be variations, modifications, and alternatives.

Next, an ion implant is performed, which places Beryllium atoms into the two top GaN and AlGaN layers. The Beryllium volume concentration is optimized in the range from $10^{19}$ cm$^{-3}$ to $10^{20}$ cm$^{-3}$. Next, the three-step annealing process is carrier out to yield a room temperature hole concentration in excess of $10^{18}$ cm$^{-3}$ in the AlGaN electron confinement layer immediately above the MQW active region. Also included in this embodiment is the use of alloy compositions of the electron confinement layer ranging from $Al_{0.10}Ga_{0.90}N$ to $Al_{0.25}Ga_{0.75}N$. Higher alloy compositions are possible than those currently used because of the shallower binding energy of Beryllium in AlGaN compared to Magnesium in AlGaN. Also in this embodiment is the use of graded bandgap $Al_xGa_{1-x}N$ Beryllium doped layers as the electron confinement layer to minimize the effects of polarization charge at the active layer/AlGaN interface. The electron confinement layer can also consist of AlGaInN quaternary alloys doped with Beryllium.

Figure 7:
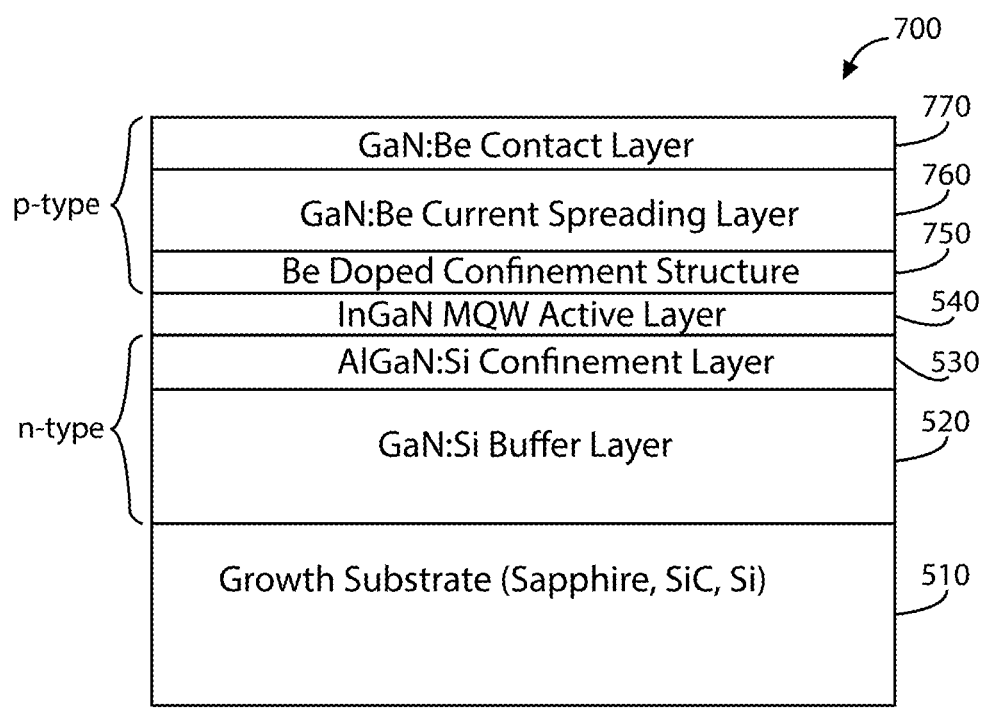

FIG. 7 represents the LED layer structure in the first embodiment after the optimized annealing process is carried out. As shown in structure 700, the undoped confinement structure 650 of FIG. 6 is formed as a Beryllium doped confinement structure 750, the undoped GaN current spreading layer 660 of FIG. 6 is formed as a Beryllium doped GaN current spreading layer 760, and the undoped GaN layer 670 of FIG. 6 is formed as a Beryllium doped GaN contact layer 770. The implant damage has been removed and the Beryllium acceptors are activated. The high temperature anneal (1500° C.) has not disordered the InGaN quantum wells in the active layer due to its extremely short duration. As a result, the emission wavelength remains unaltered by this process.

In the second embodiment, which has a Magnesium doped AlGaN confinement layer, a Magnesium doped GaN current spreading layer, and a Magnesium doped GaN ohmic contact layer is subjected to the same processing of the first preferred embodiment. Now, both Magnesium and Beryllium acceptor impurities are present in these three p-type layers. As Magnesium may present competition with Beryllium for occupation of the Ga substitutional sites in the crystal, this embodiment may not produce as large of a hole concentration in these three layers. The additional Magnesium impurities present will also lower the hole mobility in these three layers. This embodiment has the advantage of having the starting material being the same as a standard production LED wafer.

Figure 8:
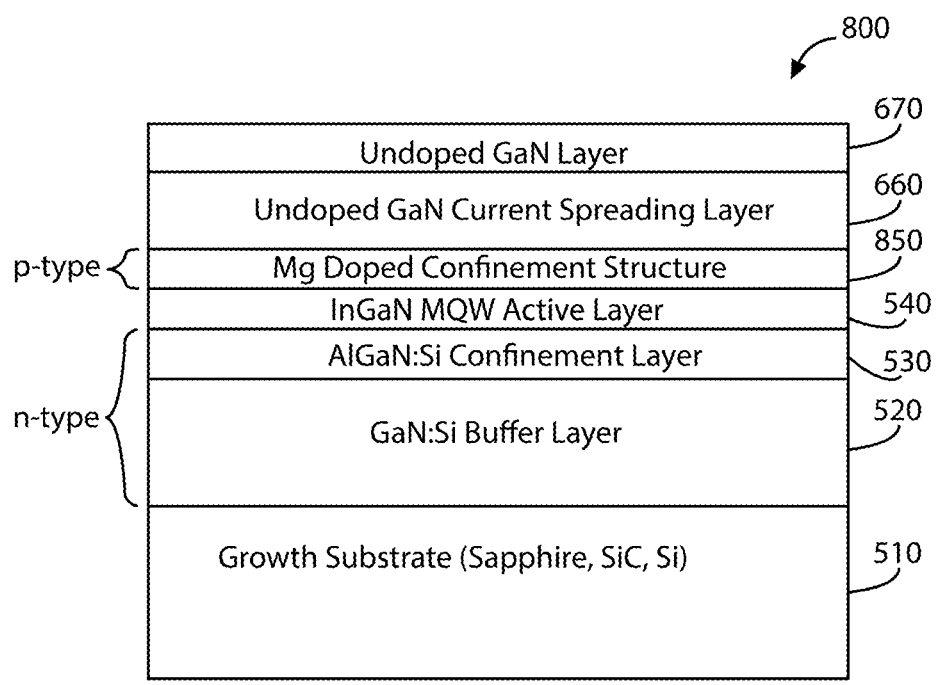
Figure 9:
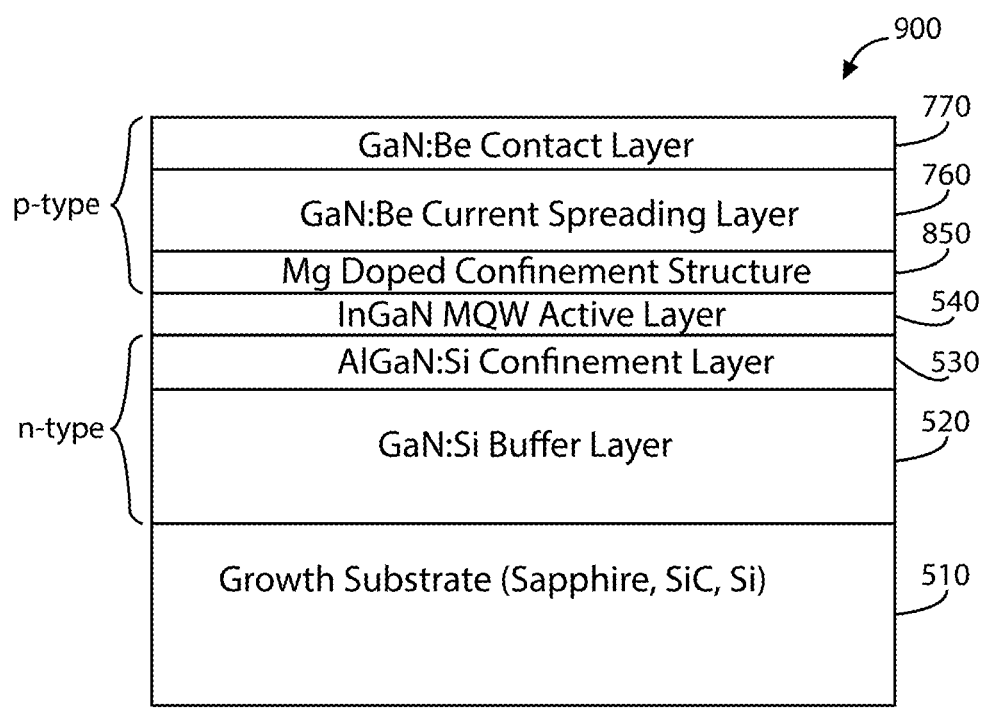

In the third embodiment, the starting structure 800 shown in FIG. 8 has a Magnesium doped confinement structure 850 of GaN, AlGaN, graded bandgap $Al_xGa_{1-x}N$, InGaN or AGaInN layers with undoped GaN current spreading and ohmic contacts layers. In this embodiment, the purpose of the Beryllium implant and activation is to lower the series resistance in the LED device by reducing the spreading resistance and the ohmic contact resistance on the p side of the diode. After the anneal process, the LED structure 800 becomes that shown in FIG. 9 (structure 900). The objective in this embodiment is to preserve an already optimized Magnesium doped confinement structure 850 (or an electron blocking structure) but improve the performance of the current spreading and ohmic contact layers. This also has the advantage of keeping ion implant damage away from the MQW active region.

In the fourth embodiment, the ohmic contact layer and the current spreading layer are Magnesium doped. The Beryllium implant is designed to penetrate only the top two layers, the ohmic contact and the current spreading layers. As Magnesium may present competition with Beryllium for occupation of the Ga substitutional sites in the crystal, this embodiment may not produce as large a hole concentration in these two layers. The additional Magnesium impurities present will also lower the hole mobility in these three layers. This embodiment has the advantage of having the starting material being the same as a standard production LED wafer.

These four embodiments are not meant to limit the scope of the invention but only serve as illustrated examples. Any LED fabrication process that incorporates Beryllium implantation and subsequent annealing cycles which results in high hole concentration, low resistivity p-type GaN-based layers are within the scope of this invention.

In an example, the method of annealing an ion implanted sample of GaN, AlGaN, InGaN, or AlGaInN consisting of a single step using a continuous wave laser annealing process, rapidly scanning over the implanted sample's surface.

In an example, the present invention provides a GaN-based pn junction, which can be configured on a device. The junction has an n-type GaN sample comprising either an intentionally doped impurity or a non-intentially doped impurity. The junction has a region of the GaN sample comprising a beryllium dopant configured by ion implanted beryllium atoms. In an example, the implanted beryllium atoms are activated within the region configured by a high temperature annealing process to form a low resistivity p-type layer of less than 10 ohm-cm to 10-3 ohm-cm. In an example, an n-type layer comprises at least one layer selected from a silicon doped layer from the group of alloys of AlGaN, InGaN, and AlGaInN; and an undoped layer selected from a group of alloys comprising one of AlGaN, InGaN, or AlGaInN.

In an example, the invention also provides a method of processing a semiconductor device. The method includes providing a semiconductor substrate. The semiconductor substrate is selected from a gallium and nitrogen bearing material. In an example, the gallium and nitrogen bearing material is at least one selected from GaN, AlGaN, InGaN, or AlGaInN. In an example the method includes introducing a plurality of impurities into a region of the semiconductor substrate using an ion implantation process such that the region has been damaged by the ion implantation process. In an example, the method includes encapsulating the region of the semiconductor substrate using a nitrogen bearing material. The nitrogen bearing material is selected from a nitride material or an ammonia material. In an example, the method includes performing an isothermal anneal at temperatures greater than 800 degrees Celsius for a time period of greater than one second on the region of the semiconductor substrate while the region has been encapsulated and subjecting the region of the semiconductor substrate using a pulsed laser to achieve a surface temperature greater than 1000 degrees Celsius for a time period of shorter than one second. The method includes performing an isothermal anneal on the region of the semiconductor substrate in a hydrogen and ammonia free ambient at temperatures in the range from 700 to 900 degrees Celsius for time period of greater than one second to facilitate removal of atomic hydrogen entities from the region of the semiconductor substrate to form a resulting region.

In an example, the aforementioned can be modified. In an example, the impurities are selected from magnesium, beryllium or silicon. In an example, the performing the isothermal anneal at the temperatures greater than 800 degrees Celsius and the subject region removes substantially all of the damage from the ion implantation process. In an example, the damage from the implant has a depth of up to about fifty nanometers to five microns in depth from the surface region of the semiconductor substrate. In an example, the region that is implanted forms a p-type material. In an example, the isothermal anneal is characterized by a bulk anneal process using a furnace. In an example, the resulting region is characterized by an activated magnesium or beryllium bearing species.

In an example, the resulting region is characterized by a resistivity of 10 ohm-cm to $10^{-3}$ ohm-cm. In an example, the resulting region is characterized by a resistivity of 10 ohm-cm to $10^{-2}$ ohm-cm. In an example, the pulsed laser is an excimer laser having a wavelength of 308 nm. In an example, the gallium and nitrogen bearing material is GaN. In an example, the nitride material comprises aluminum nitride. In an example, the nitride material comprises aluminum silicon nitride. In an example, the ammonia material comprises ammonia gas.

In an example, the encapsulating prevents a nitrogen entity from a dissociation or decomposition process from the semiconductor substrate. In an example, the region is provided for a p-n junction. In an example, the pulse laser causes the impurities to be activated within a crystalline structure of the region while the nitrogen bearing material prevents a nitrogen entity from a dissociation or decomposition process from the semiconductor substrate, while preventing a generation of one or more point defects within the crystalline structure of the region. In an example, one or more of the impurities fills a vacancy within the crystalline structure. In an example, the surface temperature is less than 1500 Degrees Celsius.

In an alternative example, the invention provides a method for processing a semiconductor substrate. The method includes providing a semiconductor substrate, the semiconductor substrate being selected from a material consisting of GaN, AlGaN, InGaN, or AlGaInN. The method includes performing an ion implantation process using a plurality of impurities to subject the semiconductor substrate to a plurality of impurities. The method includes subjecting the substrate using an annealing process of the ion implanted semiconductor substrate using a pulsed laser annealing process such that a beam of electromagnetic radiation having a top hat configuration causes a portion of the semiconductor substrate is irradiated to increase a temperature of the portion from about room temperature to greater than 1000 Degrees to about 1500 Degrees Celsius while a remaining portion of the semiconductor substrate remains at room temperature. The method includes concurrently with the annealing process activating the impurities to form a region having a resistivity of about 10 ohm-cm to $10^{-3}$ ohm-cm. In an example, the term concurrently means within a same time period range or slightly outside of such range depending upon the application.

In an example, the invention provides a GaN-based light emitting diode (LED) structure. The structure has a substrate member, the substrate member being selected from at least one of a sapphire member, a SiC member, a GaN member, a AlN member, or a silicon member. The structure has a GaN buffer layer comprising a n-type doping material deposited on a surface region of the substrate member, an AlGaN confinement layer comprising an n-type doping material deposited directly overlying the GaN n-type buffer layer, and an InGaN/GaN multi-quantum well (MQW) active region, doped or undoped, grown directly overlying the n-type AlGaN confinement layer. In an example, the structure has an undoped AlGaN layer to serve as an electron confinement layer. The structure can also have optionally, an undoped GaN layer to serve as a current spreading and ohmic contact layer grown directly overlying the undoped AlGaN confinement layer. In an example, each of the undoped AlGaN layer and the undoped GaN layer comprises a plurality of beryllium impurities configured using ion implantation and configured to be activated by a high temperature annealing process such that a resulting beryllium doped material characterized by a low resistivity of less than 10 ohm-cm, p-type layers to $10^{-3}$ ohm-cm.

In an example to the aforementioned, as well as other examples, the electron confinement layer is a layer selected from one of: a GaN Beryllium implanted p-type layer, a InGaN Beryllium implanted p-type layer, a AlInGaN Beryllium implanted p-type layer, a graded bandgap $Al_xGa_{1-x}N$ Beryllium implanted p-type layer, or a graded bandgap $Al_xIn_yGa_{1-x-y}N$ Beryllium implanted p-type layer.

In an example, each of the electron confinement layer and the ohmic contact and current spreading layers comprises a magnesium doped confinement region, a current spreading region, and an ohmic contact layer provided prior to an ion implant and an annealing process. In an example, the current spreading layer is not optional. In an example, the MQW active region is optionally replaced with a doped or undoped GaN material. In an example, the MQW active region is optionally replaced with a doped or an undoped AlGaN.

In an example, the present invention provides a GaN-based LED structure. The structure has a growth substrate being selected from a sapphire substrate, a SiC substrate, a GaN substrate, a AlN substrate or a silicon substrate. The structure has a GaN buffer layer comprising an n-type dopant formed overlying the growth substrate. The structure has an AlGaN confinement layer comprising an n-type dopant formed directly overlying the GaN n-type buffer layer and a InGaN/GaN MQW active region, doped or undoped, formed directly overlying the n-type AlGaN confinement layer. The structure has a magnesium doped AlGaN layer configured to serve as an electron confinement layer and an undoped GaN layer configured to serve as a current spreading and an ohmic contact layer formed directly on top of a surface of the undoped AlGaN confinement layer. In an example, the undoped GaN layer comprises a plurality of beryllium impurities provided by ion implanted beryllium atoms such that the implanted beryllium atoms are activated configured by a high temperature annealing process to cause a low resistivity p-type layer of less than 10 to $10^{-3}$ ohm-cm.

In an example to the aforementioned, as well as other examples, the electron confinement layer comprises a layer selected from one of a GaN Magnesium doped p-type layer, a InGaN Magnesium doped p-type layer, a AlInGaN Magnesium doped p-type layer, a graded bandgap $Al_xGa_{1-x}N$ Magnesium doped p-type layer, or a graded bandgap $Al_xIn_yGa_{1-x-y}N$ Magnesium doped p-type layer. In an example, each of the ohmic contact and current spreading layers comprises a magnesium doped current spreading, and a ohmic contact layer provided prior to an ion implant and an annealing process. In an example, the current spreading layer is optional in the LED structure. In an example, the MQW active region is optionally replaced with a doped or an undoped GaN. In an example, the MQW active region is optionally replaced with a doped or an undoped AlGaN.

In an example, the present invention provides a method of forming a GaN-based LED structure. The method includes providing a substrate member. In an example, the substrate member is selected from at least one of a sapphire member, a SiC member, a GaN member, a AlN member, or a silicon member. The method includes forming a GaN buffer layer comprising a n-type doping material deposited on a surface region of the substrate member, forming an AlGaN confinement layer comprising an n-type doping material deposited directly overlying the GaN n-type buffer layer, and forming an InGaN/GaN MQW active region, doped or undoped, grown directly overlying the n-type AlGaN confinement layer. In an example, the method includes forming an undoped AlGaN layer to serve as an electron confinement layer, and optionally, an undoped GaN layer to serve as a current spreading and ohmic contact layer grown directly overlying the undoped AlGaN confinement layer. In an example, each of the undoped AlGaN layer and the undoped GaN layer comprises a plurality of beryllium impurities configured using ion implantation and configured to be activated by a high temperature annealing process such that a resulting beryllium doped material characterized by a low resistivity of less than 10 ohm-cm, p-type layers to $10^{-3}$ ohm-cm.

In an example, the present invention provides a method of fabricating a GaN-based LED structure. The method includes providing a growth substrate being selected from a sapphire substrate, a SiC substrate, a GaN substrate, a AlN substrate or a silicon substrate. The method includes forming a GaN buffer layer comprising an n-type dopant formed overlying the growth substrate, forming an AlGaN confinement layer comprising an n-type dopant formed directly overlying the GaN n-type buffer layer, and forming a InGaN/GaN MQW active region, doped or undoped, formed directly overlying the n-type AlGaN confinement layer. The method includes forming a magnesium doped AlGaN layer configured to serve as an electron confinement layer and forming an undoped GaN layer configured to serve as a current spreading and an ohmic contact layer formed directly on top of a surface of the undoped AlGaN confinement layer. In an example, the undoped GaN layer comprises a plurality of beryllium impurities provided by ion implanted beryllium atoms such that the implanted beryllium atoms are activated configured by a high temperature annealing process to cause a low resistivity p-type layer of less than 10 to $10^{-3}$ ohm-cm.

While the above is a full description of the specific embodiments, various modifications, alternative constructions and equivalents may be used. As an example, the implanted gallium and nitrogen containing region can include any combination of elements described above, as well as outside of the present specification. As used herein, the term "substrate" can mean the bulk substrate or can include overlying growth structures such as a gallium and nitrogen containing epitaxial region, or functional regions, combinations, and the like. In an example, the structure can mean a portion of a device or a device. Therefore, the above description and illustrations should not be taken as limiting the scope of the present invention which is defined by the appended claims.

What is claimed is:

1. A GaN-based light emitting diode (LED) device, comprising:
   a substrate member, the substrate member being selected from at least one of a sapphire member, a SiC member, a GaN member, a AlN member, or a silicon member;
   a GaN buffer layer comprising a n-type doping material deposited on a surface region of the substrate member;
   an AlGaN confinement layer comprising an n-type doping material deposited directly overlying the GaN n-type buffer layer;
   an InGaN/GaN multi-quantum well (MQW) active region grown directly overlying the AlGaN confinement layer;
   an AlGaN layer to serve as an electron confinement layer; and
   optionally, an GaN layer to serve as a current spreading and ohmic contact layer grown directly overlying the undoped AlGaN confinement layer;
   wherein each of the AlGaN layer and the GaN layer comprises a plurality of beryllium impurities configured using ion implantation such that a region has been damaged by the ion implantation and configured to be activated by a high temperature annealing process that comprises an isothermal anneal on the region in a hydrogen and ammonia free ambient at temperatures in the range from 700 to 900 degrees Celsius for time period of greater than one second to facilitate removal of atomic hydrogen entities from the region such that a resulting beryllium doped material characterized by a low resistivity of less than 10 ohm-cm, p-type layers to 10-3 ohm-cm.

2. The device of claim 1 wherein the electron confinement layer is a layer selected from one of:
   a GaN Beryllium implanted p-type layer,
   a InGaN Beryllium implanted p-type layer,
   a AlInGaN Beryllium implanted p-type layer,
   a graded bandgap $Al_xGa_{1-x}N$ Beryllium implanted p-type layer, or
   a graded bandgap $Al_xIn_yGa_{1-x-y}N$ Beryllium implanted p-type layer.

3. The device of claim 1 wherein each of the electron confinement layer and the ohmic contact and current spreading layers comprises a magnesium doped confinement region, a current spreading region, and an ohmic contact layer provided prior to an ion implant and an annealing process.

4. The device of claim 1 wherein the current spreading layer is not optional.

5. The device of claim 1 wherein the MQW active region is optionally replaced with a doped or undoped GaN material.

6. The device of claim 1 wherein the MQW active region is optionally replaced with an doped or undoped AlGaN.

7. The device of claim 1 wherein the region is encapsulated using a nitrogen bearing material.

8. The device of claim 7 wherein nitrogen bearing material is selected from a nitride material or an ammonia material.

9. The device of claim 8 wherein the region is subjected to an isothermal anneal at temperatures greater than 800 degrees Celsius for a time period of greater than one second on the region while the region has been encapsulated.

10. The device of claim 9 wherein the region is subjected to a pulsed laser to achieve a surface temperature greater than 1000 degrees Celsius for a time period of shorter than one second.

11. A GaN-based light emitting diode (LED) device, comprising:
    a substrate member, the substrate member being selected from at least one of a sapphire member, a SiC member, a GaN member, a AlN member, or a silicon member;
    a GaN buffer layer comprising a n-type doping material deposited on a surface region of the substrate member;
    an AlGaN confinement layer comprising an n-type doping material deposited directly overlying the GaN n-type buffer layer;
    an InGaN/GaN multi-quantum well (MQW) active region grown directly overlying the AlGaN confinement layer;

an AlGaN layer to serve as an electron confinement layer; and optionally, an GaN layer to serve as a current spreading and ohmic contact layer grown directly overlying the AlGaN confinement layer;

wherein each of the AlGaN layer and the GaN layer comprises a plurality of beryllium impurities configured using ion implantation such that a region has been damaged by the ion implantation and configured to be activated by a high temperature annealing process that comprises an isothermal anneal on the region in a hydrogen and ammonia free ambient at temperatures in the range from 700 to 900 degrees Celsius for time period of greater than one second to facilitate removal of atomic hydrogen entities from the region such that a resulting beryllium doped material characterized by a low resistivity of less than 10 ohm-cm, p-type layers to 10-3 ohm-cm.

12. The device of claim 11 wherein the electron confinement layer is a layer selected from one of:
a GaN Beryllium implanted p-type layer,
a InGaN Beryllium implanted p-type layer,
a AlInGaN Beryllium implanted p-type layer,
a graded bandgap $Al_xGa_{1-x}N$ Beryllium implanted p-type layer, or
a graded bandgap $Al_xIn_yGa_{1-x-y}N$ Beryllium implanted p-type layer.

13. The device of claim 11 wherein each of the electron confinement layer and the ohmic contact and current spreading layers comprises a magnesium doped confinement region, a current spreading region, and an ohmic contact layer provided prior to an ion implant and an annealing process.

14. The device of claim 11 wherein the current spreading layer is not optional.

15. The device of claim 11 wherein the MQW active region is optionally replaced with a doped or undoped GaN material.

16. The device of claim 11 wherein the MQW active region is optionally replaced with an doped or undoped AlGaN.

17. The device of claim 11 wherein the region is encapsulated using a nitrogen bearing material.

18. The device of claim 17 wherein nitrogen bearing material is selected from a nitride material or an ammonia material.

19. The device of claim 18 wherein the region is subjected to an isothermal anneal at temperatures greater than 800 degrees Celsius for a time period of greater than one second on the region while the region has been encapsulated.

20. The device of claim 19 wherein the region is subjected to a pulsed laser to achieve a surface temperature greater than 1000 degrees Celsius for a time period of shorter than one second.

* * * * *